US011104991B2

United States Patent
Kamio et al.

(10) Patent No.: US 11,104,991 B2
(45) Date of Patent: Aug. 31, 2021

(54) PROCESSING APPARATUS AND COVER MEMBER

(71) Applicant: TOKYO ELECTRON LIMITED, Tokyo (JP)

(72) Inventors: Takashi Kamio, Nirasaki (JP); Toshiaki Fujisato, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 366 days.

(21) Appl. No.: 15/787,916

(22) Filed: Oct. 19, 2017

(65) Prior Publication Data
US 2018/0112309 A1   Apr. 26, 2018

(30) Foreign Application Priority Data

Oct. 24, 2016   (JP) .............................. JP2016-208129

(51) Int. Cl.
| | |
|---|---|
| C23C 16/44 | (2006.01) |
| C23C 16/455 | (2006.01) |
| C23C 16/52 | (2006.01) |
| C23C 16/34 | (2006.01) |

(52) U.S. Cl.
CPC .......... *C23C 16/4412* (2013.01); *C23C 16/34* (2013.01); *C23C 16/45502* (2013.01); *C23C 16/45517* (2013.01); *C23C 16/45544* (2013.01); *C23C 16/45557* (2013.01); *C23C 16/45565* (2013.01); *C23C 16/45591* (2013.01); *C23C 16/52* (2013.01)

(58) Field of Classification Search
CPC ............ C23C 16/4558; C23C 16/4585; C23C 16/4412; C23C 16/45544; H01L 21/68721; H01L 21/68735
See application file for complete search history.

(56) References Cited

U.S. PATENT DOCUMENTS 6,096,135 A * 8/2000 Guo .................. C23C 16/45521
118/729
2001/0042514 A1* 11/2001 Mizuno ............... C23C 16/4412
118/728

(Continued)

FOREIGN PATENT DOCUMENTS

| | | | |
|---|---|---|---|
| JP | 201056561 A | 3/2010 | |
| KR | 1020120135253 A | 12/2012 | |
| KR | 1020160002855 A | 1/2016 | |

*Primary Examiner* — Keath T Chen
*Assistant Examiner* — Margaret D Klunk
(74) *Attorney, Agent, or Firm* — Nath, Goldberg & Meyer; Jerald L. Meyer; Tanya E. Harkins

(57) ABSTRACT

There is provided a processing apparatus including a stage disposed inside a chamber, and a cover member provided in an outer edge portion of the stage and configured to partition an interior of the chamber into a processing space above the stage and a bottom space below the stage. The cover member includes a first protrusion portion configured to make surface-to-surface contact with a surface of the stage, a second protrusion portion spaced apart from the first protrusion portion and configured to make surface-to-surface contact with the surface of the stage, and an exhaust path provided between the first protrusion portion and the second protrusion portion and configured to exhaust a gas from a buffer space formed by the cover member and the stage.

5 Claims, 5 Drawing Sheets

(56) References Cited

U.S. PATENT DOCUMENTS

| | | | |
|---|---|---|---|
| 2004/0069227 A1* | 4/2004 | Ku | C23C 16/4585 118/721 |
| 2010/0218785 A1* | 9/2010 | Green | H01J 37/32862 134/1.1 |
| 2013/0000558 A1* | 1/2013 | Hara | C23C 16/16 118/724 |
| 2016/0060756 A1* | 3/2016 | Park | C23C 16/4586 118/725 |

* cited by examiner

PROCESSING APPARATUS AND COVER MEMBER

CROSS-REFERENCE TO RELATED APPLICATION

This application is based upon and claims the benefit of priority from Japanese Patent Application No. 2016-208129, filed on Oct. 24, 2016, the entire contents of which are incorporated herein by reference.

TECHNICAL FIELD

The present disclosure relates to a processing apparatus and a cover member.

BACKGROUND

In an ALD (Atomic Layer Deposition) film forming apparatus or the like, a film forming process is performed at a temperature higher than the temperature of an ordinary process of about 530 degrees C. so as to reduce impurities in a film to thereby improve the film strength. For example, a TiN (titanium nitride) film is formed at a high temperature of around 600 degrees C. to increase the strength of the film, thereby suppressing the pattern collapse and improving the yield.

In some film forming apparatuses, oxides are deposited on a stage on which a wafer is mounted, which results in becoming particles. Therefore, it has been proposed to provide a purge gas passage on the edge side of a wafer so that an apparatus can be used without causing problems until the amount of oxides deposited on a stage reaches a certain amount. This makes it difficult for a process gas to enter the edge side of the wafer, thereby reducing the amount of deposits on the stage.

However, when a film forming process is performed to form a TiN film at a high temperature of, for example, about 600 degrees C., the strength of deposits on the stage is increased, and the deposits are easily crystallized and cracked. As a result, the columnar pieces of the broken deposits fly toward the edge side of the wafer and become particles.

Further, in the case of using the conventional film forming method described above, the purge gas is directly supplied to the edge side of the wafer. Therefore, a gas stagnates at a place where a process gas supplied to the upper region of a stage and a purge gas directly supplied to the wafer edge may confront each other. Thus, particles are easily generated.

SUMMARY

Some embodiments of the present disclosure provide a processing apparatus and a cover member capable of suppressing the generation of particles at an outer edge portion of a stage arranged inside a chamber.

According to one embodiment of the present disclosure, there is provided a processing apparatus including a stage disposed inside a chamber, and a cover member provided in an outer edge portion of the stage and configured to partition an interior of the chamber into a processing space above the stage and a bottom space below the stage. The cover member includes a first protrusion portion configured to make surface-to-surface contact with a surface of the stage, a second protrusion portion spaced apart from the first protrusion portion and configured to make surface-to-surface contact with the surface of the stage, and an exhaust path provided between the first protrusion portion and the second protrusion portion and configured to exhaust a gas from a buffer space formed by the cover member and the stage.

According to another embodiment of the present disclosure, there is provided a cover member provided in an outer edge portion of a stage disposed inside a chamber, and configured to partition an interior of the chamber into a processing space above the stage and a bottom space below the stage. The cover member includes a first protrusion portion configured to make surface-to-surface contact with a surface of the stage, a second protrusion portion spaced apart from the first protrusion portion and configured to make surface-to-surface contact with the surface of the stage, and an exhaust path provided between the first protrusion portion and the second protrusion portion and configured to exhaust a gas from a buffer space formed by the cover member and the stage.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
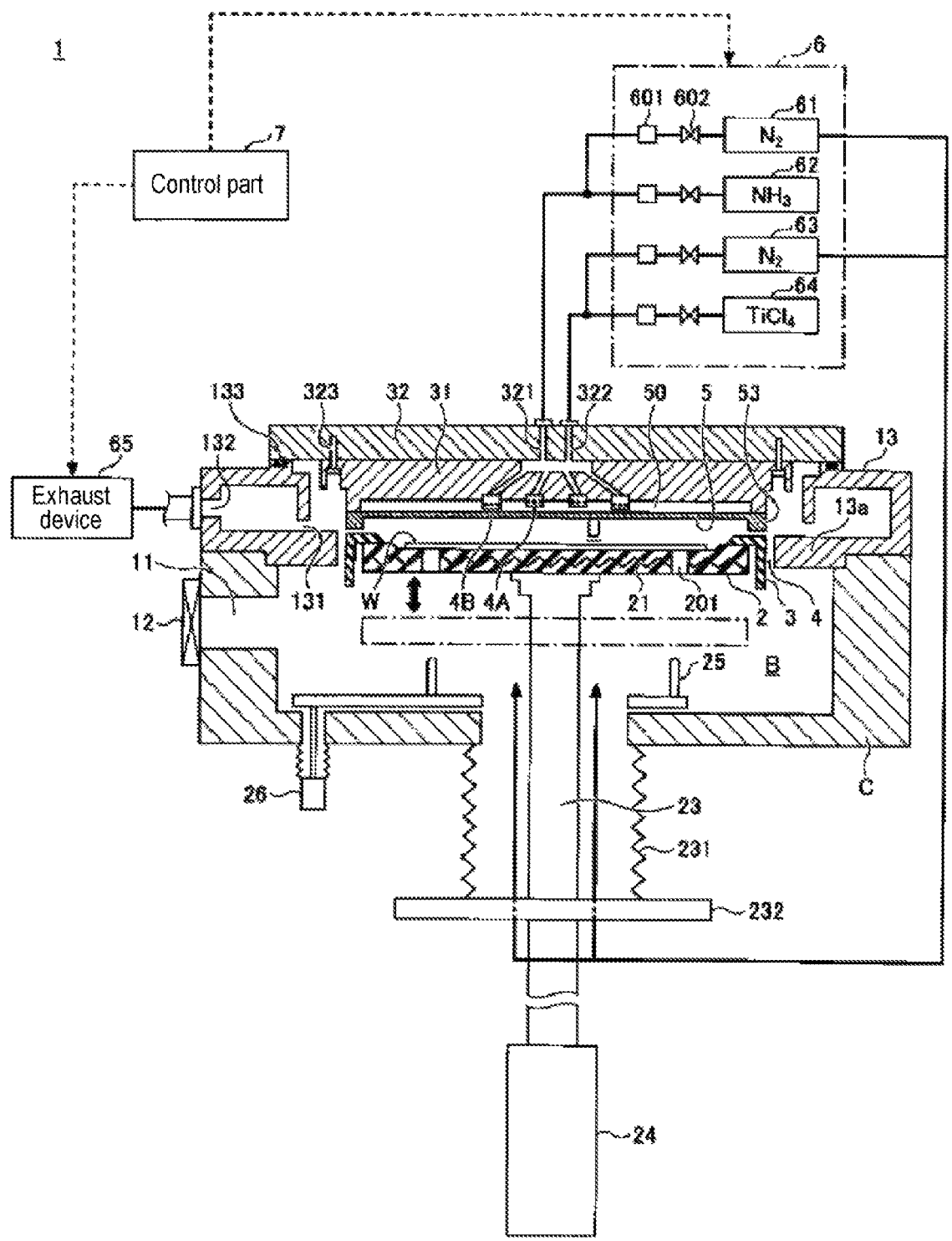
FIG. 1 is a view showing a vertical cross section of a film forming apparatus according to one embodiment.

A mode for carrying out the present disclosure will be described below with reference to the drawings. In the subject specification and the drawings, substantially the same components are denoted by the same reference numerals, and redundant description is omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Configuration of Film Forming Apparatus]

First, the overall configuration of a film forming apparatus 1 according to one embodiment of the present disclosure will be described with reference to FIG. 1. FIG. 1 shows a vertical cross section of a film forming apparatus 1 according to one embodiment of the present disclosure. In the present embodiment, an ALD film forming apparatus is exemplified as the film forming apparatus 1. The film forming apparatus 1 is an example of a processing apparatus that performs a predetermined process such as the film formation or the like on a semiconductor wafer (hereinafter referred to as "wafer W") by the action of gas.

The film forming apparatus 1 includes a vacuum processing container (hereinafter referred to as "chamber C") which is made of a metal such as aluminum or the like and which has a substantially circular plan-view shape. In the chamber C, there is provided a stage 2 on which the wafer W is mounted. At the side surface of the chamber C, there are provided a loading/unloading port 11 for allowing a wafer transfer mechanism provided in an external vacuum transfer path to enter the chamber C when transferring the wafer W to and from the stage 2, and a gate valve 12 for opening and closing the loading/unloading port 11.

At a position above the loading/unloading port 11, an exhaust port 13, which is formed by annularly bending a duct which is made of a metal such as aluminum or the like and which has a rectangular vertical cross section, is provided so as to be overlapped on a sidewall constituting a main body of the chamber C. A slit-shaped opening 131 extending along the circumferential direction is formed on the inner peripheral surface of the exhaust port 13. A gas flowing out from a processing space U is exhausted from the exhaust port 13 via the opening 131. In this manner, the inside of the exhaust port 13 serves as an exhaust space for exhausting the inside of the chamber C. An exhaust hole 132 is formed at the outer wall surface of the exhaust port 13. An exhaust device 65 formed of a vacuum pump or the like is connected to the exhaust hole 132. The interior of the chamber C is controlled to a predetermined depressurized state by the exhaust device 65.

In the chamber C, the stage 2 is disposed at a position inside the exhaust port 13. The stage 2 is formed of a disc that is slightly larger than the wafer W and is made of, for example, ceramics such as aluminum nitride (AlN), quartz glass ($SiO_2$) or the like, or a metal such as aluminum (Al), HASTELLOY (registered trademark) or the like. Inside the stage 2, there is buried a heater 21 for heating the stage 2 such that the temperature of the stage 2 becomes a film formation temperature of, for example, 540 degrees C. to 600 degrees C. If necessary, an electrostatic chuck for holding the wafer W on the stage 2 may be provided.

On the stage 2, a cover member 3 is provided so as to cover the region of the outer peripheral side outside the mounting region of the wafer W (namely, the outer edge portion of the stage 2) and the side circumferential surface of the stage 2 in the circumferential direction. The cover member 3 is made of, for example, alumina ($Al_2O_3$), quartz, sapphire or the like, and is formed in a substantially cylindrical shape with its upper and lower ends opened. The upper end portion of the cover member 3 is horizontally bent inward over the circumferential direction. The bent portion engages with the surface of the outer edge portion of the stage 2. The thickness dimension of the bent portion is formed thicker than the thickness dimension of the wafer W.

A support member 23 penetrating the bottom surface of the chamber C and extending in the vertical direction is connected to the central portion of the lower surface of the stage 2. The lower end portion of the support member 23 is connected to an elevating mechanism 24 via a plate-like support base 232 horizontally disposed below the chamber C. The elevating mechanism 24 raises and lowers the stage 2 between a transfer position (indicated by a one-dot chain line in FIG. 1) where the wafer W is transferred to and from the wafer transfer mechanism entering from the loading/unloading port 11 and a processing position where film formation on the wafer W is performed above the transfer position.

Between the bottom surface of the chamber C through which the support member 23 passes and the support base 232, a bellows 231 that separates the atmosphere in the chamber C from the outside and expands and contracts as the support base 232 moves up and down is provided so as to cover the support member 23 from the outside in the circumferential direction.

For example, three support pins 25 for supporting and lifting the wafer W from the lower surface at the time of transferring the wafer W to and from the external wafer transfer mechanism are provided below the stage 2. The support pins 25 are connected to the elevating mechanism 26 so as to be movable up and down. By projecting and retracting the support pins 25 from the upper surface of the stage 2 via the through holes 201 penetrating the stage 2 in the vertical direction, the wafer W is transferred to and from the wafer transfer mechanism.

A disk-shaped support plate 32 is provided on the upper surface of the exhaust port 13 so as to close the circular opening. An O-ring 133 for keeping the interior of the chamber C airtight is disposed between the exhaust port 13 and the support plate 32. A top plate member 31 for supplying a process gas and a carrier gas to the processing space U above the stage 2 is provided on the lower surface of the support plate 32. The top plate member 31 is supported on and fixed to the support plate 32 by bolts 323. The top plate member 31 and the support plate 32 constitute a ceiling portion of the film forming apparatus 1.

A recess portion is formed on the lower surface of the top plate member 31. The region of the center side of the recess portion is flat. On the other hand, at a position below the top plate member 31, a gas shower head 5, which is a gas diffusion plate, is provided so as to cover the entire lower surface of the top plate member 31. The gas shower head 5 includes a disc portion made of, for example, a metal and having a flat surface facing the stage 2 and an annular protrusion portion 53 formed in the peripheral edge portion of the disc portion so as to protrude downward.

When the stage 2 is raised to the processing position, the lower end of the annular protrusion portion 53 is arranged to face the upper surface of the cover member 3 provided on the stage 2. The space surrounded by the lower surface of the gas shower head 5, the annular protrusion portion 53 and the upper surface of the stage 2 serves as the processing space U in which the film formation on the wafer W is performed.

Figure 2:
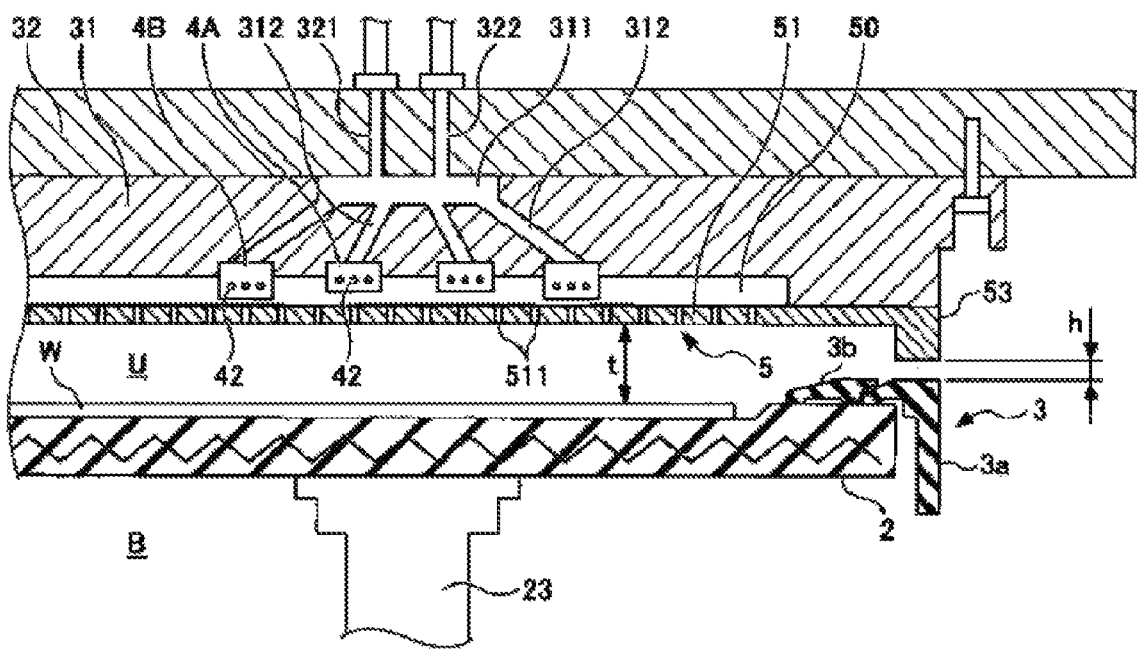
FIG. 2 is a view showing a vertical cross section in which a stage (partially omitted) of a film forming apparatus according to one embodiment is enlarged.

As shown in FIG. 2, the height position of the processing position is set to form a gap of height h between the lower end of the annular protrusion portion 53 and the upper surface of the bent portion of the cover member 3. The opening 131 of the exhaust port 13 shown in FIG. 1 is opened toward this gap. The height h of the gap between the lower end of the annular protrusion portion 53 and the cover member 3 is set to, for example, 3.0 mm which falls in a range of 0.2 to 10.0 mm.

The top plate member 31 and the gas shower head 5 are fastened by bringing them into contact with each other, whereby a diffusion space 50 for diffusing a gas is formed. A large number of gas discharging holes 511 are formed throughout the entire bottom portion of the diffusion space 50. Thus, a process gas or a carrier gas (for example, nitrogen gas or the like) can be supplied toward the wafer W.

In the gas shower head 5 of this example, the diameter of the diffusion space 50 (namely, the diameter of the gas supply region 51) is 310 mm and the height dimension of the diffusion space 50 is 8 mm Four first gas distribution portions 4A are arranged at equal intervals along a first circle about the center portion of the wafer W. Eight second gas distribution portions 4B are arranged at equal intervals along a second circle, which is concentric with the first circle, outside the first circle.

The gas shower head 5 having a diffusion space 50 with a diameter of 310 mm is disposed above the central portion of the wafer W placed on the stage 2. Thus, the gas discharging hole 511 of the outmost side of the gas shower head 5 is positioned outside the outer edge of the wafer W having a diameter of 300 mm when viewed in a plan view.

As shown in FIG. 2, the height t from the upper surface of the wafer W on the stage 2 to the gas discharging holes 511 of the gas supply region 51 is set to about 6 to 50 mm, more desirably about 7 to 17 mm. When the height t is larger than 50 mm, a substitution efficiency of gas decreases.

Gas supply paths 312 for supplying a gas to the first and second gas distribution portions 4A and 4B are formed in the top plate member 31 provided with the first and second gas distribution portions 4A and 4B. These gas supply paths 312 are connected to a diffusion portion 311 that constitutes a gas buffer chamber formed between the upper surface of the top plate member 31 and the lower surface of the support plate 32.

Referring to FIGS. 1 and 2, in the support plate 32, an ammonia supply path 321 for supplying an ammonia gas and a nitrogen gas, which is an example of a carrier gas, to the diffusion portion 311 is formed in the support plate 32 and is connected to the gas supply part 6. A titanium chloride supply path 322 for supplying a titanium chloride gas and a nitrogen gas, which is an example of a carrier gas, to the diffusion portion 311 is formed in the support plate 32 and is connected to the gas supply part 6. The gas supply part 6 includes nitrogen gas supply parts 61 and 63, an ammonia gas supply part 62, a titanium chloride gas supply part 64, an opening/closing valve 602, and a flow rate adjustment part 601.

The ammonia supply path 321 and the titanium chloride supply path 322 are connected to the ammonia gas supply part 62 and the titanium chloride gas supply part 64 via pipes. Each of the pipes is branched off in the middle thereof and is connected to the nitrogen gas supply parts 61 and 63. The opening/closing valve 602 for feeding and cutting off gas and the flow rate adjustment part 601 for adjusting a gas supply amount are provided in each of the pipes. For the convenience of illustration, the nitrogen gas supply parts 61 and 63 are separately shown in FIG. 1. However, the nitrogen gas supply parts 61 and 63 may use a common nitrogen supply source.

The film forming apparatus is connected to a control part 7. The control part 7 may be, for example, a computer having a CPU and a memory. In the memory, there is recorded a program which incorporates a step group for the control of raising the wafer W to the processing position, executing the formation of a TiN film or the like by supplying a reaction gas and a carrier gas into the processing space U in a predetermined order, and unloading the wafer W. This program is stored in a storage medium such as a hard disk, a compact disk, a magneto-optical disk, a memory card, etc., and is installed in the computer from the storage medium. The control part 7 controls the exhaust device 65, the gas supply part 6 and the like in accordance with the procedure of the program.

Next, the operation of the film forming apparatus 1 according to the present embodiment will be described. Initially, the interior of the chamber C is depressurized to a vacuum atmosphere in advance by the exhaust device 65. Thereafter, the stage 2 is lowered to the transfer position. Then, the gate valve 12 is opened, and the transfer arm of the wafer transfer mechanism provided in the vacuum transfer chamber connected to the loading/unloading port 11 enters the chamber C to transfer the wafer W to and from the support pins 25. Thereafter, the support pins 25 are lowered, and the wafer W is mounted on the stage 2, which is heated to a high temperature in a range of, for example, 540 degrees C. to 600 degrees C. by the heater 21.

Next, the gate valve 12 is closed, the stage 2 is raised to the processing position, and the pressure in the chamber C is regulated. Thereafter, a titanium chloride gas is supplied from the titanium chloride gas supply part 64. The titanium chloride gas thus supplied flows toward the first and second gas distribution portions 4A and 4B through the titanium chloride supply path 322, the diffusion portion 311 and the gas supply path 312.

The titanium chloride gas supplied from the gas supply path 312 to the first and second gas distribution portions 4A and 4B is introduced from a plurality of gas introduction ports 42 into the diffusion space 50 to be diffused in a horizontal direction.

The gas introduced into the diffusion space 50 in this way is sufficiently reduced in speed due to the pressure loss occurring when the gas passes through the large number of gas discharging holes 511 of the gas shower head 5. The gas is distributed and supplied to the processing space U.

The titanium chloride gas supplied to the processing space U flows toward the peripheral edge direction of the wafer W and is exhausted. For this reason, the titanium chloride gas flowing from the diffusion space 50 above the gas shower head 5 toward the processing space U is supplied to the wafer W while flowing in the peripheral edge direction of the processing space U. For example, the titanium chloride gas supplied from the gas discharging holes 511 descends within the processing space U and reaches the wafer W mounted on the stage 2. A part of the titanium chloride gas is adsorbed to the wafer W. The remaining titanium chloride gas radially spreads in the radial direction along the surface of the wafer W while a part of the titanium chloride gas is adsorbed onto the surface of the wafer W.

The titanium chloride gas flowing inside the processing space U and reaching the gap between the lower end of the annular protrusion portion 53 and the cover member 3 flows out from the gap and is exhausted to the outside through the exhaust port 13. Since the titanium chloride gas supplied to the processing space U is supplied to the wafer W while flowing in the peripheral direction of the wafer W, the central portion of the wafer W is hardly supplied with the titanium chloride gas, and the peripheral edge side of the wafer W is amply supplied with the titanium chloride gas.

In the flow described above, the pressure loss occurring when the gas flows from the processing space U toward the surrounding exhaust port 13 is adjusted by providing the annular protrusion portion 53 in the peripheral edge portion of the gas shower head 5 and appropriately setting the height of the gap between the annular protrusion portion 53 and the cover member 3. As a result, after each reaction gas is allowed to stay in the processing space U by a sufficient time for adsorbing the reaction gas on the wafer W, it is possible to evenly discharge the reaction gas toward the circumferential outer side where the gap is formed.

Next, the supply of the titanium chloride gas is stopped, and a nitrogen gas, which is an example of the carrier gas, is supplied from the nitrogen gas supply part 63. The nitrogen gas is supplied into the processing space U through the same route as the titanium chloride gas, and the titanium chloride gas in the route and the processing space U is substituted with the nitrogen gas.

After supplying the nitrogen gas for a predetermined time and performing the gas substitution, the supply of the nitrogen gas is stopped and the ammonia gas is supplied from the ammonia gas supply part 62. The ammonia gas thus supplied flows into the first and second gas distribution portions 4A and 4B via the ammonia supply path 321, the diffusion portion 311 and the gas supply path 312. The ammonia gas introduced into the diffusion space 50 from the first and second gas distribution portions 4A and 4B forms a flow similar to that in the case of the titanium chloride gas and is supplied into the processing space U.

The bottom surface of the exhaust port 13 protrudes from the side wall of the chamber C. The bottom space B, which is the lower region of the stage 2, and the processing space U, which is the upper region of the stage 2, are partitioned by the protrusion portion 13*a* and the cover member 3.

With this configuration, the interior of the chamber C is divided into the following three types of areas.

1. A minimized reaction chamber (processing space U) for obtaining high substitution efficiency for film formation exists above the stage 2.
2. The bottom space B of a large capacity for transferring the wafer W is positioned below the processing space U (the stage 2).
3. An exhaust space of the exhaust port 13 exists in a ring shape on the outer periphery of the processing space U.

The bottom space B is a space wider than the processing space U. In order to avoid the process gas from flowing into the bottom space B, a bottom purge gas such as a nitrogen gas or the like is introduced into the bottom space B from the gas supply part 6 via the space between the bellows 231 and the support member 23. The bottom purge gas introduced into the bottom space B is not limited to the nitrogen gas but may be an inert gas.

The bottom purge gas introduced into the bottom space B flows from the gap 4 between the cover member 3 and the protrusion portion 13*a* of the exhaust port 13 to the exhaust port 13 and is exhausted. Thus, the bottom purge gas can prevent the process gas from flowing into the bottom space B and can cool the cover member 3.

[Cover Member]

Figure 4A:
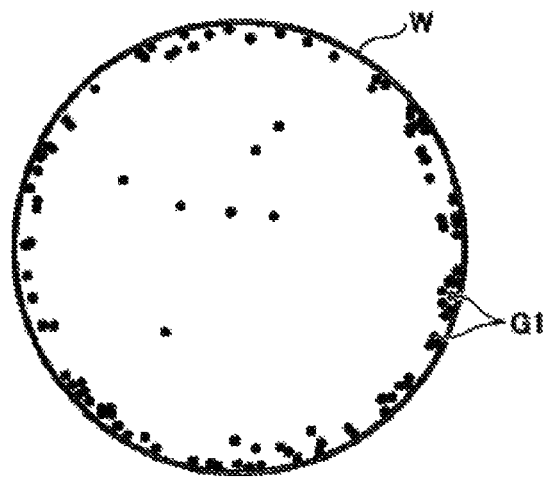
FIGS. 4A to 4C are views showing an example of a verification result in a film forming apparatus according to one embodiment and a comparative example.
Figure 4B:
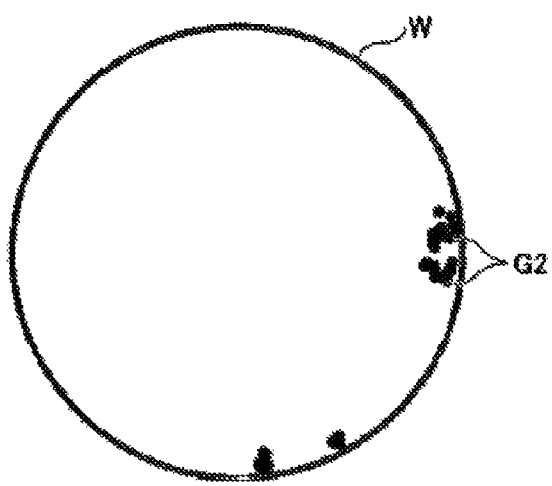
Figure 4C:
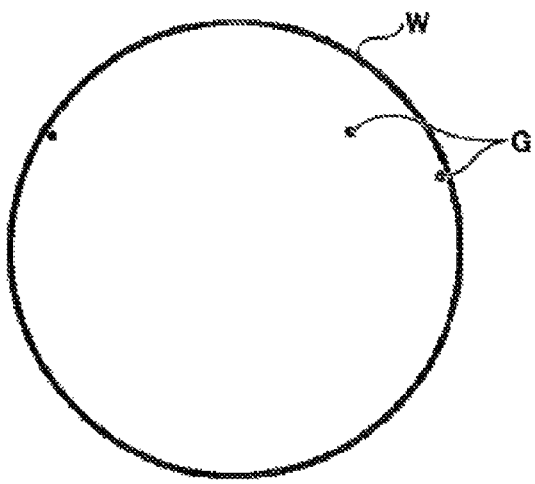
Figure 5:
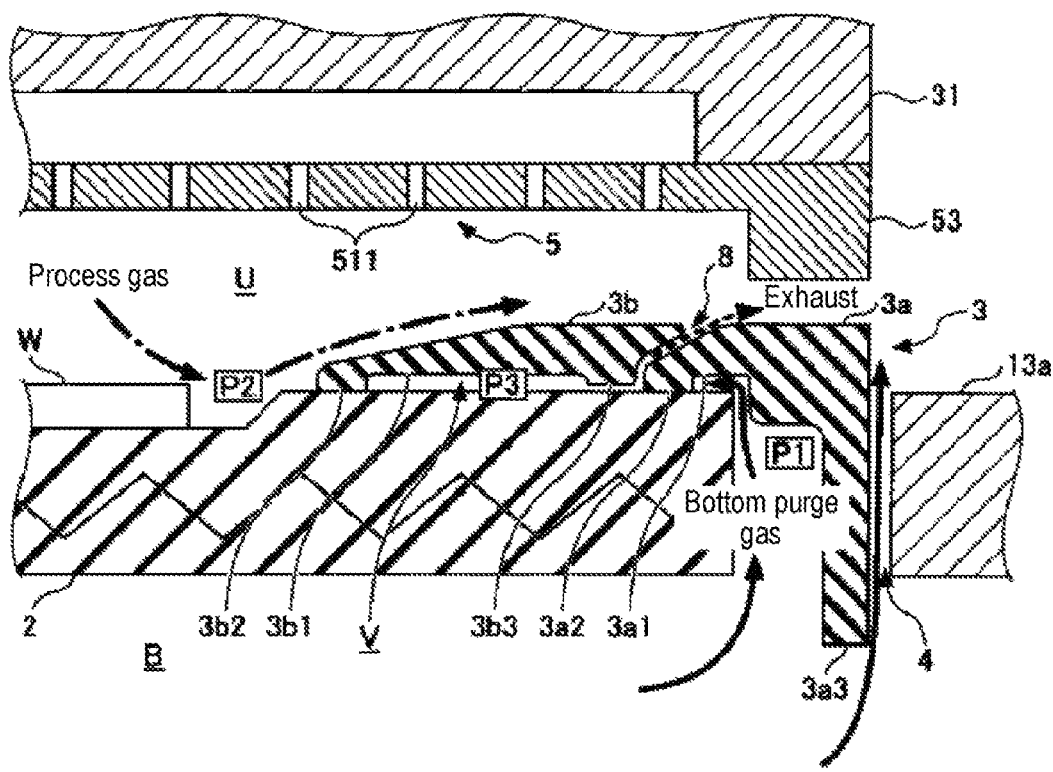
FIG. 5 is a view showing a vertical cross section in which an outer edge portion of a stage of a film forming apparatus according to one embodiment is enlarged.

Next, the cover member 3 according to the present embodiment will be described in detail with reference to FIGS. 3 to 5. The cover member 3 is provided in the outer edge portion of the stage 2, and is configured to divide the interior of the chamber C into the processing space U above the stage 2 and the bottom space B below the stage 2.

First, with reference to FIGS. 3A to 3C, the cover member 3 according to the present embodiment shown in FIG. 3C will be described in comparison with a cover member 91 according to comparative example 1 shown in FIG. 3A and a cover member 92 according to comparative example 2 shown in FIG. 3B.

For example, if a film is formed by setting the stage temperature to a high temperature of about 540 degrees C. to 600 degrees C., it is possible the enhance the strength of the film. This is because the impurities introduced in the film decrease when a film is formed at a high temperature, so that the film becomes harder which results in increasing the stress in the film. Therefore, in the high-temperature film forming process, the deposits, which are exposed to the processing space U and exist on the surface of the outer edge portion of the stage 2 of a high temperature during the film formation, are crystallized. The crystallized deposits are hard and thus fragile. As a result, columnar masses (particles) resulting from the crack of the crystallized deposits are generated on the surface of the outer edge portion of the stage 2.

Figure 3A:
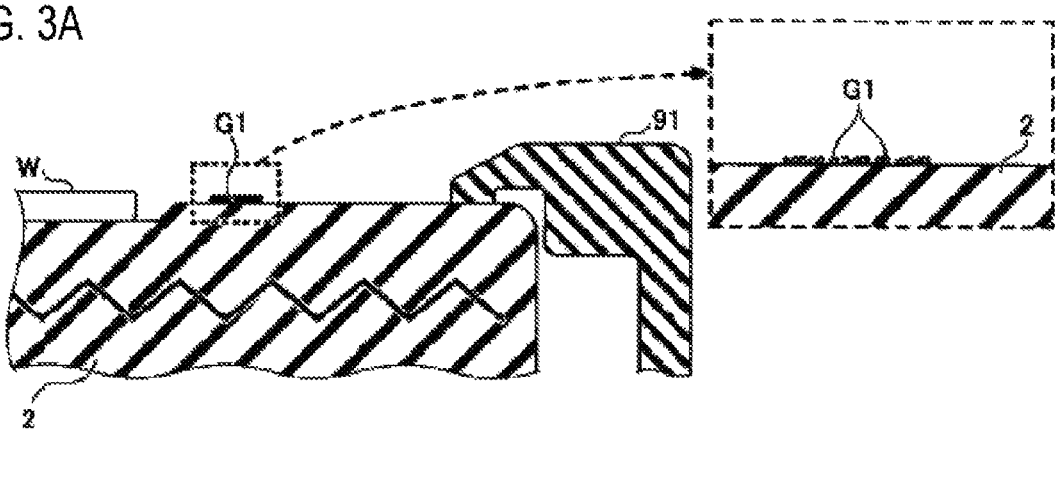
FIGS. 3A to 3C are views showing a cover member of a film forming apparatus according to one embodiment and a cover member of a comparative example.

In the cover member 91 according to comparative example 1 shown in FIG. 3A, there is shown an example where a columnar particles G1 are generated on the surface of the outer edge portion of the stage 2 exposed between the wafer W and the cover member 91. FIG. 4A shows an example of a verification result obtained when the cover member 91 according to comparative example 1 is used. It can be seen that a large number of particles G1 are generated particularly on the edge side on the wafer W.

Figure 3B:
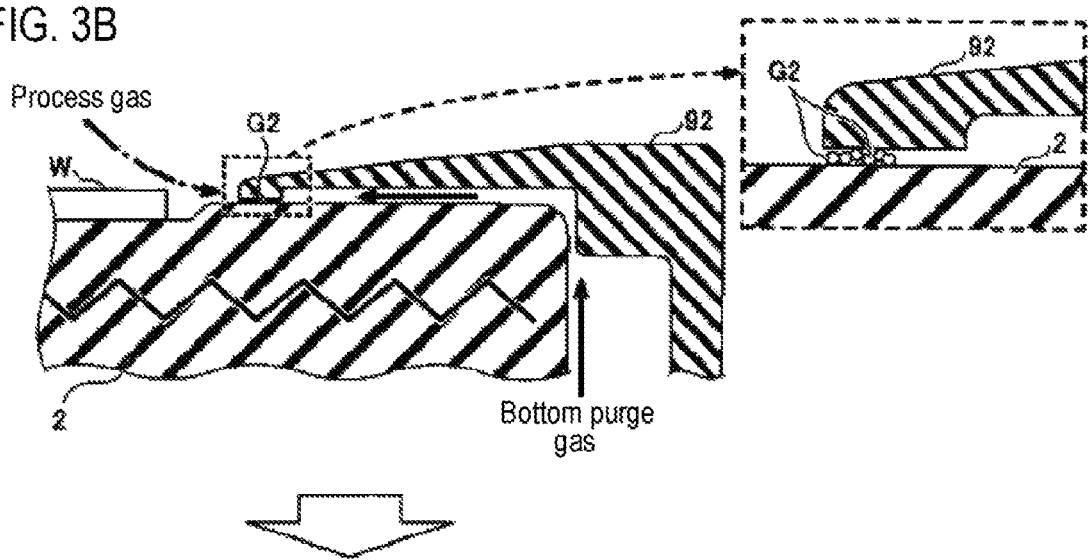

The cover member 92 according to comparative example 2 shown in FIG. 3B covers the surface of the outer edge portion of the stage 2 by extending the bent portion to the surface of the outer edge portion of the stage 2. This makes it possible to reduce the surface temperature of the portion exposed to the processing space U. As a result, it is possible to suppress the generation of columnar particles.

However, in the structure of the cover member 92 shown in FIG. 3B, the front end portion of the bent portion of the cover member 92 extending on the surface of the stage 2 becomes a confronting point of the bottom purge gas coming from the bottom space B and the process gas coming from the processing space U. The flow of the gases stagnates at the confronting point. As a result, spherical particles G2 are generated. FIG. 4B shows an example of a verification result in the case of using the cover member 92 according to comparative example 2. It can be noted that particles G2, which are fewer in number than the columnar particles G1 but larger in size than the columnar particles G1, are generated particularly on the edge side on the wafer W.

Figure 3C:
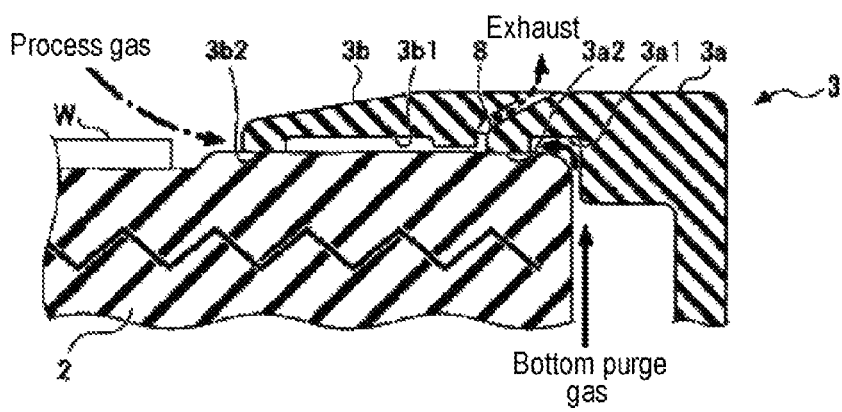

On the other hand, as shown in FIG. 3C, the cover member 3 according to the present embodiment has a configuration in which the cover member 3 is divided into an outer ring member 3*a* and an inner ring member 3*b*. A first protrusion portion 3*b*2 protruding downward is provided at the front end of the inner ring member 3*b* on the side of the wafer W. The first protrusion portion 3*b*2 makes surface-to-surface contact with the surface of the outer edge portion of the stage 2.

A second protrusion portion 3*a*2 protruding downward is provided at the front end of the outer ring member 3*a* of the side of the wafer W. The second protrusion portion 3*a*2 is spaced apart from the first protrusion portion 3*b*2 at a more outward side by, for example, several millimeters, than the first protrusion portion 3*b*2. The second protrusion portion 3*a*2 makes surface-to-surface contact with the surface of the outer edge portion of the stage 2.

The radial width of a contact surface at which the first protrusion portion 3*b*2 and the second protrusion portion 3*a*2 make surface-to-surface contact with the stage 2 is about 2 mm Thus, it is possible to prevent a residue from being generated between the cover member 3 and the stage 2 during cleaning.

Thus, as the process gas flowing from the processing space U and the bottom purge gas flowing from the bottom space B are blocked by the first protrusion portion 3*b*2 and the second protrusion portion 3*a*2, respectively, it is possible to eliminate the confronting point. As a result, by eliminating the stagnation of the gas at the confronting point, it is possible to prevent the generation of a spherical particle G2.

Furthermore, in the cover member 3 according to the present embodiment, the space between the outer ring member 3*a* and the inner ring member 3*b* is formed as an exhaust path 8. The structure of the cover member 3 and the like according to the present embodiment will be described in more detail with reference to FIG. 5. The exhaust path 8 is provided between the first protrusion portion 3b2 and the second protrusion portion 3a2 and is configured to exhaust the gas staying in a buffer space V formed by the recess 3b1 provided in the inner ring member 3b and the stage 2.

In addition, in the cover member 3, the first protrusion portion 3b2 and the second protrusion portion 3a2 merely make surface-to-surface contact with the stage 2. Other portions of the cover member 3 are not in contact with the stage 2. One of the reasons is that when the contact area between the stage 2 and the cover member 3 is large, the residues of reaction products remain in the gap between the stage 2 and the cover member 3 even if the interior of the chamber C is cleaned, which may be a factor for the increased number of particles. Another reason is that when the contact area between the stage 2 and the cover member 3 is large, the temperature of the cover member 3 rises, which may be a factor for generating crystallized columnar particles on the cover member 3.

The process gas in the processing space U mainly enters the buffer space V from the small gap between the stage 2 and the first protrusion portion 3b2. Furthermore, the bottom purge gas in the bottom space B mainly enters the buffer space V from the small gap between the stage 2 and the second protrusion portion 3a2 through the recess 3a1 of the outer ring member 3a. The entered gas is exhausted from the exhaust path 8 between the outer ring member 3a and the inner ring member 3b to the side of the exhaust space (exhaust port 13).

A convex portion 3b3 is provided at the front end portion of the inner ring member 3b, which is opposite to the first protrusion portion 3b2. The convex portion 3b3 is not in contact with the stage 2. As a result, the gas in the buffer space V can be exhausted from the exhaust path 8. The convex portion 3b3 is used for determining a position of the cover member 3 when the cover member 3 is installed in the outer edge portion of the stage 2. The convex portion 3b3 may be omitted.

The bottom purge gas introduced into the bottom space B flows from the gap 4 between the side wall portion 3a3 of the outer ring member 3a and the side wall of the protrusion portion 13a of the exhaust port 13 toward the exhaust port 13 and is exhausted. In addition, the process gas and the carrier gas introduced into the processing space U flow from the opening 131 toward the exhaust port 13 and are exhausted.

The inner ring member 3b, which includes the first protrusion portion 3b2, is an example of a first member formed so as to cover the surface of the outer edge portion of the stage 2. The outer ring member 3a, which includes the second protrusion portion 3a2, is an example of a second member formed so as to cover the surface of the outer edge portion of the stage 2 on the outside of the first member.

According to such a configuration, the cover member 3 is provided in the outer edge portion of the stage 2, thereby partitioning the interior of the chamber C into the processing space U above the stage 2 and the bottom space B below the stage 2. In addition, since the cover member 3 is provided so as to cover the outer peripheral surface of the stage 2, it is possible to reduce the temperature of the portion exposed to the processing space U. Thus, it is possible to reduce the stress of the deposit existing in the outer edge portion of the stage 2, which results in preventing the deposit from being brittle, and preventing columnar particles from being generated.

Further, according to the cover member 3 having such a configuration, the portions making surface-to-surface contact with the stage 2 are limited to two portions, i.e., the first protrusion portion 3b2 and the second protrusion portion 3a2. This makes it possible to heat insulate the stage 2 and the cover member 3.

In addition, the first protrusion portion 3b2 blocks the process gas flowing from the processing space U, and the second protrusion portion 3a2 blocks the bottom purge gas flowing from the bottom space B. At this time, since the first protrusion portion 3b2 and the second protrusion portion 3a2 are separated from each other, it is possible to separate the confronting point between the bottom purge gas and the process gas. This makes it possible to prevent spherical particles from being generated.

Furthermore, the exhaust path 8 exhausts the gas existing in the buffer space V. This makes it possible to eliminate the stagnation of the gases. In particular, the exhaust path 8 is inclined toward the exhaust space for exhausting the inside of the chamber C and is opened toward the exhaust space. Thus, the exhausted gas can flow smoothly. As a result, the gas existing in the buffer space V is exhausted smoothly from the exhaust port 13 via the opening 131. As a result, the number of particles G on the wafer W can be drastically reduced as shown in FIG. 4C which shows an example of a verification result in the case of using the cover member 3 according to the present embodiment.

[Cover Member and Pressure]

It is assumed that the pressure in the processing space U is P2, the pressure in the bottom space B is P1, and the pressure in the buffer space V is P3. At this time, the control part 7 controls the exhaust device 65 and the gas supply part so that the relationship between the pressures P1 to P3 becomes P2>P3 and P1>P3. This makes it possible to smoothly exhaust the gas in the buffer space V between the cover member 3 and the stage 2 toward the exhaust port 13.

As described above, the cover member 3 covers the surface of the outer edge portion of the stage 2 and partially makes surface-to-surface contact with stage 2 only in the first protrusion portion 3b2 and the second protrusion portion 3a2. It is therefore possible to suppress the surface exposed to the processing space U from reaching a high temperature in the high-temperature film forming process performed at a temperature of about 600 degrees C. This makes it possible to prevent columnar particles from being generated.

In addition, the confronting point between the bottom purge gas and the process gas can be separated by the first protrusion portion 3b2 and the second protrusion portion 3a2. Moreover, the gas staying in the buffer space V between the cover member 3 and the stage 2 can be exhausted by the exhaust path 8 to eliminate gas stagnation. This makes it possible to prevent spherical particles from being generated.

Although the processing apparatus and the cover member have been described above based on the embodiment, the processing apparatus and the cover member according to the present disclosure are not limited to the above-described embodiment. Various modifications and improvements may be made within the scope of the present disclosure. The matters described in the above embodiment may be combined unless a conflict arises.

For example, the cover member according to the above embodiment is an example of the cover member according to the present disclosure, and the cover member according to the present disclosure may not be divided into the outer ring member 3a and the inner ring member 3b. Even in this case, the cover member is provided with a first protrusion portion, a second protrusion portion and an exhaust path for exhausting a gas from a buffer space formed between them. The exhaust path may penetrate the cover member so as to communicate with the buffer space.

For example, the present disclosure can be applied to not only the ALD film forming apparatus shown in FIG. 1 but also a CVD (Chemical Vapor Deposition) apparatus and the like.

In the subject specification, the semiconductor wafer W has been described as a substrate to be film-formed. However, the present disclosure is not limited thereto. The substrate to be film-formed may be various substrates used in an LCD (Liquid Crystal Display), a FPD (Flat Panel Display) or the like, a photomask, a CD substrate, a printed substrate, and so forth.

According to the present disclosure in some embodiments, it is possible to suppress the generation of particles at an outer edge portion of a stage arranged inside a chamber.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A processing apparatus, comprising:
   a stage disposed inside a chamber and including a mounting region configured to mount a substrate thereon and an outer edge portion disposed outside the mounting region and having a flat surface; and
   a cover member provided in the outer edge portion of the stage to be spaced apart outwardly from the mounting region of the stage, and configured to partition an interior of the chamber into a processing space above the stage and a bottom space below the stage,
   wherein the cover member includes:
   a first protrusion portion configured to make surface-to-surface contact with the flat surface of the outer edge portion along a horizontal direction of the flat surface;
   a second protrusion portion spaced apart from the first protrusion portion, and configured to make surface-to-surface contact with the flat surface of the outer edge portion;
   a convex portion disposed between the first protrusion portion and the second protrusion portion, the convex portion protruding toward the flat surface of the outer edge portion and spaced apart from the flat surface of the outer edge portion; and
   an exhaust path provided between the first protrusion portion and the second protrusion portion, and configured to exhaust a gas from a buffer space formed by the cover member and the stage,
   wherein the exhaust path is opened and inclined toward an exhaust space for exhausting the interior of the chamber,
   wherein the cover member is a ring shaped member, and
   wherein the first protrusion portion protrudes toward the stage and is disposed on an inner front end of the ring shaped member.

2. The apparatus of claim 1, wherein the cover member includes:
   a first member having the first protrusion portion, and formed so as to cover a surface of the outer edge portion of the stage; and
   a second member having the second protrusion portion, and formed so as to cover the surface of the outer edge portion of the stage on the outside of the first member.

3. The apparatus of claim 2, wherein the exhaust path is a space between the first member and the second member.

4. The apparatus of claim 1, wherein the first protrusion portion is configured to block a gas flowing from the processing space, the second protrusion portion is configured to block a gas flowing from the bottom space, and the exhaust path is configured to exhaust a gas leaking from the side of the first protrusion portion or the side of the second protrusion portion into the buffer space.

5. A cover member provided in a stage, which is disposed inside a chamber and includes a mounting region configured to mount a substrate thereon and an outer edge portion disposed outside the mounting region and having a flat surface, and configured to partition an interior of the chamber into a processing space above the stage and a bottom space below the stage, wherein the cover member is provided in the outer edge portion of the stage to be spaced apart outwardly from the mounting region of the stage, the cover member comprising:
   a first protrusion portion configured to make surface-to-surface contact with the flat surface of the outer edge portion along a horizontal direction of the flat surface;
   a second protrusion portion spaced apart from the first protrusion portion and configured to make surface-to-surface contact with the flat surface of the outer edge portion;
   a convex portion disposed between the first protrusion portion and the second protrusion portion, the convex portion protruding toward the flat surface of the outer edge portion and spaced apart from the flat surface of the outer edge portion; and
   an exhaust path provided between the first protrusion portion and the second protrusion portion and configured to exhaust a gas from a buffer space formed by the cover member and the stage,
   wherein the exhaust path is opened and inclined toward an exhaust space for exhausting the interior of the chamber,
   wherein the cover member is a ring shaped member, and
   wherein the first protrusion portion protrudes toward the stage and is disposed on an inner front end of the ring shaped member.

\* \* \* \* \*